United States Patent
Rahmani et al.

(10) Patent No.: US 11,768,980 B2
(45) Date of Patent: Sep. 26, 2023

(54) WEAR ANALYSIS OF DRILL BITS

(71) Applicant: National Oilwell Varco, L.P., Houston, TX (US)

(72) Inventors: Reza Rahmani, The Woodlands, TX (US); Afshin Babaie Aghdam, Houston, TX (US)

(73) Assignee: National Oilwell Varco, L.P., Houston, TX (US)

(*) Notice: Subject to any disclaimer, the term of this patent is extended or adjusted under 35 U.S.C. 154(b) by 441 days.

(21) Appl. No.: 17/085,381

(22) Filed: Oct. 30, 2020

(65) Prior Publication Data
US 2021/0131268 A1 May 6, 2021

Related U.S. Application Data

(60) Provisional application No. 62/927,874, filed on Oct. 30, 2019.

(51) Int. Cl.
*G06F 30/20* (2020.01)
*E21B 47/013* (2012.01)
*E21B 45/00* (2006.01)
*E21B 10/06* (2006.01)
*E21B 10/16* (2006.01)

(52) U.S. Cl.
CPC ............ *G06F 30/20* (2020.01); *E21B 10/16* (2013.01); *E21B 45/00* (2013.01); *E21B 47/013* (2020.05)

(58) Field of Classification Search
CPC ........ E21B 10/16; E21B 45/00; E21B 47/013; G06F 30/20
See application file for complete search history.

(56) References Cited

U.S. PATENT DOCUMENTS

| | | | |
|---|---|---|---|
| 8,028,764 B2 | 10/2011 | Teodorescu | |
| 9,115,552 B2* | 8/2015 | Chen | E21B 10/42 |
| 2005/0015229 A1* | 1/2005 | Huang | E21B 10/00 703/10 |
| 2005/0051361 A1* | 3/2005 | Singh | E21B 10/08 175/40 |
| 2008/0029308 A1* | 2/2008 | Chen | E21B 10/16 175/331 |
| 2009/0166091 A1* | 7/2009 | Matthews | E21B 10/08 703/7 |
| 2010/0139988 A1* | 6/2010 | Mensa-Wilmot | E21B 10/567 175/431 |
| 2014/0231142 A1* | 8/2014 | Poitzsch | E21B 47/07 175/50 |
| 2015/0152689 A1 | 6/2015 | Chen et al. | |

* cited by examiner

*Primary Examiner* — Hyun D Park
*Assistant Examiner* — Lynda Dinh
(74) *Attorney, Agent, or Firm* — Conley Rose, P.C.

(57) ABSTRACT

A method includes receiving a drill bit design. The design specifies a design parameter for a plurality of cutter elements of a drill bit. The method also includes estimating a temperature value for the cutter elements based on the design parameter and a drilling parameter; estimating a wear value for the cutter elements based on the design parameter and the temperature value; updating a value of the design parameter for at least one of the cutter elements based on the wear value and a time period; and using the updated design parameter value, repeating the steps of estimating the temperature value, estimating the wear value, and updating the design parameter value until the design parameter value for the at least one of the cutter elements reaches a threshold value.

18 Claims, 9 Drawing Sheets

WEAR ANALYSIS OF DRILL BITS

CROSS-REFERENCE TO RELATED APPLICATIONS

This application claims the benefit of U.S. Provisional Patent Application No. 62/927,874 filed Oct. 30, 2019, and entitled "Wear Analysis of Drill Bits", which is incorporated herein by reference in its entirety.

STATEMENT REGARDING FEDERALLY SPONSORED RESEARCH OR DEVELOPMENT

Not applicable.

BACKGROUND

The disclosure relates generally to drill bits, and their design, used for drilling a borehole in an earthen formation for the ultimate recovery of oil, gas, or minerals. More particularly, the disclosure relates to designing drill bits to improve the thermal wear life of drill bit cutter elements.

An earth-boring drill bit is typically mounted on the lower end of a drill string and is rotated by rotating the drill string at the surface or by actuation of downhole motors or turbines, or by both methods. With weight applied to the drill string, the rotating drill bit engages the earthen formation and proceeds to form a borehole along a predetermined path toward a target zone. The borehole thus created will have a diameter generally equal to the diameter or "gage" of the drill bit.

Fixed cutter bits, also known as rotary drag bits, are one type of drill bit commonly used to drill boreholes. Fixed cutter bit designs include a plurality of blades angularly spaced about the bit face. The blades generally project radially outward along the bit body and form flow channels there between. In addition, cutter elements are often grouped and mounted on several blades. The configuration or layout of the cutter elements on the blades may vary widely, depending on a number of factors.

The cutter elements disposed on the several blades of a fixed cutter bit are typically formed of extremely hard materials and include a layer of polycrystalline diamond ("PCD") material. In the typical fixed cutter bit, each cutter element or assembly comprises an elongate and generally cylindrical support member which is received and secured in a pocket formed in the surface of one of the several blades. In addition, each cutter element typically has a hard cutting layer of polycrystalline diamond or other superabrasive material such as cubic boron nitride, thermally stable diamond, polycrystalline cubic boron nitride, or ultrahard tungsten carbide (meaning a tungsten carbide material having a wear-resistance that is greater than the wear-resistance of the material forming the substrate) as well as mixtures or combinations of these materials. The cutting layer is exposed on one end of its support member, which is typically formed of tungsten carbide. For convenience, as used herein, reference to "PDC bit" or "PDC cutter element" refers to a fixed cutter bit or cutter element employing a hard cutting layer of polycrystalline diamond or other superabrasive material such as cubic boron nitride, thermally stable diamond, polycrystalline cubic boron nitride, or ultrahard tungsten carbide.

BRIEF SUMMARY OF THE DISCLOSURE

Examples of the present disclosure are directed to a method including receiving a drill bit design. The design specifies a design parameter for a plurality of cutter elements of a drill bit. The method also includes estimating a temperature value for the cutter elements based on the design parameter and a drilling parameter; estimating a wear value for the cutter elements based on the design parameter and the temperature value; updating a value of the design parameter for at least one of the cutter elements based on the wear value and a time period; and using the updated design parameter value, repeating the steps of estimating the temperature value, estimating the wear value, and updating the design parameter value until the design parameter value for the at least one of the cutter elements reaches a threshold value.

Other examples of the present disclosure are directed to a non-transitory, computer-readable medium containing instructions that, when executed by a processor, cause the processor to receive a drill bit design that specifies a design parameter for a plurality of cutter elements of a drill bit; estimate a temperature value for the cutter elements based on the design parameter and a drilling parameter; estimate a wear value for the cutter elements based on the design parameter and the temperature value; update a value of the design parameter for at least one of the cutter elements based on the wear value and a time period; and using the updated design parameter value, repeat the steps of estimating the temperature value, estimating the wear value, and updating the design parameter value until the design parameter value for the at least one of the cutter elements reaches a threshold value.

Still other examples of the present disclosure are directed to a system including a memory and a processor coupled to the memory. The memory is configured to store a drill bit design specifying a design parameter for a plurality of cutter elements of a drill bit. The processor is configured to receive the drill bit design from the memory; estimate a temperature value for the cutter elements based on the design parameter and a drilling parameter; estimate a wear value for the cutter elements based on the design parameter and the temperature value; update a value of the design parameter for at least one of the cutter elements based on the wear value and a time period; and using the updated design parameter value, repeat the steps of estimating the temperature value, estimating the wear value, and updating the design parameter value until the design parameter value for the at least one of the cutter elements reaches a threshold value.

BRIEF DESCRIPTION OF THE DRAWINGS

For a detailed description of the preferred embodiments of the invention, reference will now be made to the accompanying drawings in which.

DETAILED DESCRIPTION

Figure 1:
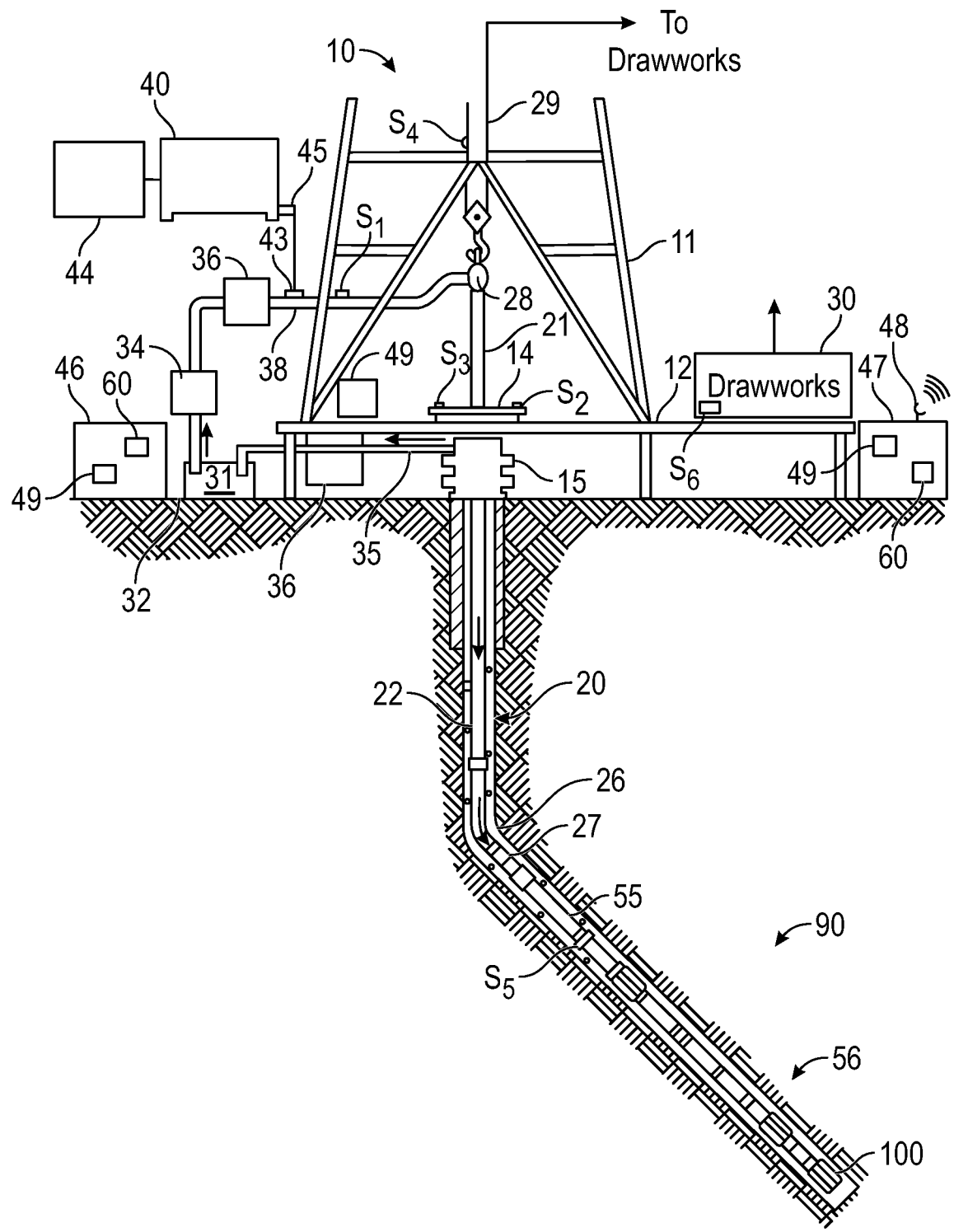
FIG. 1 is a schematic view of a drilling system including a drill bit in accordance with the principles described herein.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. Any reference to up or down in the description and the claims will be made for purposes of clarity, with "up", "upper", "upwardly" or "upstream" meaning toward the surface of the borehole and with "down", "lower", "downwardly" or "downstream" meaning toward the terminal end of the borehole, regardless of the borehole orientation.

Drilling a borehole in an earthen formation involves rotating a drill bit and pumping drilling fluid through the drill string and out of the face of the drill bit. A fixed cutter bit typically includes nozzles or fixed ports spaced about the bit face that serve to inject drilling fluid into the flow passageways between the several blades. The flowing fluid performs several important functions. The fluid removes formation cuttings from the bit's cutting structure. Otherwise, accumulation of formation materials on the cutting structure may reduce or prevent the penetration of the cutting structure into the formation. In addition, the fluid removes cut formation materials from the bottom of the hole. Failure to remove formation materials from the bottom of the hole may result in subsequent passes by cutting structure to re-cut the same materials, thereby reducing the effective cutting rate and potentially increasing wear on the cutting surfaces. The drilling fluid and cuttings removed from the bit face and from the bottom of the hole are forced from the bottom of the borehole to the surface through the annulus that exists between the drill string and the borehole sidewall. Further, the fluid removes heat, caused by contact with the formation, from the cutter elements in order to prolong cutter element life. Thus, the number and placement of drilling fluid nozzles, and the resulting flow of drilling fluid, may significantly impact the performance of the drill bit, in particular the thermal wear life of the PDC cutter elements.

Without regard to the type of bit, the cost of drilling a borehole for recovery of hydrocarbons may be high, and is proportional to the length of time it takes to drill to the desired depth and location. The time required to drill the well, in turn, is affected by the number of times the drill bit must be changed before reaching the targeted formation. For example, each time the bit is changed, the entire string of drill pipe, which may be miles long, is retrieved from the borehole, section by section. Once the drill string has been retrieved and the new bit installed, the bit is lowered to the bottom of the borehole on the drill string, which again is constructed section by section. As a result, this process, known as a "trip" of the drill string, requires considerable time, effort, and expense. Accordingly, examples of this disclosure are directed to designing drill bits that drill faster and longer, reducing a number of trips. The length of time that a drill bit may be employed before it must be changed depends upon a variety of factors, including wear life of the PDC cutter elements.

As previously described, PDC cutter elements are affected by thermal factors and other operational factors (e.g., friction) that lead to increased wear. In certain examples, the thermal factors acting on the various cutter elements is disproportionate, leading to increased wear on certain cutter elements relative to other cutter elements. Although drilling fluid is used to cool the cutter elements, various drill bit designs may result in certain cutter elements having more or less available cooling capacity (e.g., exposure to drilling fluid) than others.

In addition, PDC cutter elements wear differently over time. That is, the wear behavior of a cutter element may change as that cutter element becomes more worn. In some cases, a cutter element may experience increased rates of wear as it becomes more worn. In other cases, a cutter element may experience decreased rates of wear as it becomes more worn. Examples of this disclosure are directed to more accurately modeling wear rates as a function of wear, or wear rates over time as cutter elements become more worn. This allows a more accurate understanding of an overall lifespan of a particular drill bit design. For example, a first drill bit design may appear to perform better (e.g., have a greater rate of penetration (ROP)) when its cutter elements are new or unworn. However, the first drill bit design may experience a shorter overall lifespan (e.g., its cutter elements wear faster over time), resulting in a shorter achievable run length with the first drill bit design. On the other hand, a second drill bit design may have a lower initial ROP relative to the first drill bit design, but a longer overall lifespan as its cutter elements become worn, resulting in a longer achievable run length than the first drill bit design and higher average ROP throughout the run.

Embodiments described herein are directed to a method for estimating an operating parameter for the cutter elements of a drill bit, such as a temperature value or a temperature rise over a baseline temperature value, during operation of the drill bit. The operating parameter is used to estimate or predict wear of the cutter elements of the drill bit over time. The wear of the cutter elements of the drill bit may be predicted by updating one or more design parameters of the cutter elements, such as tip geometry of the cutter elements (e.g., an initially-round tip geometry may become flattened over time) and/or a wear depth of the cutter elements (e.g., a distance or depth of material that is removed from a cutter element relative to a baseline value, or from a value established in a previous iteration of prediction). The wear of the cutter elements of the drill bit is predicted over time until at least one of the cutter elements reaches a threshold value of wear, such as where a cutter element becomes worn to the point of no longer engaging the formation (e.g., the cutter element is flush with surrounding portions of the drill bit). In some cases, the predicted wear of the cutter elements is used to alter design parameters of the drill bit to increase the estimated run length achievable by the drill bit during operation. Embodiments described herein are also directed to drill bits designed using such methods. As will be described in more detail below, embodiments of the method and drill bits described herein seek to improve the wear life of cutter elements of the drill bit, and thus the drill bit as a whole.

Referring now to FIG. 1, a schematic view of an embodiment of a drilling system 10 in accordance with the principles described herein is shown. Drilling system 10 includes a derrick 11 having a floor 12 supporting a rotary table 14 and a drilling assembly 90 for drilling a borehole 26 from derrick 11. Rotary table 14 is rotated by a prime mover such as an electric motor (not shown) at a desired rotational speed and controlled by a motor controller (not shown). In other embodiments, the rotary table (e.g., rotary table 14) may be augmented or replaced by a top drive suspended in the derrick (e.g., derrick 11) and connected to the drillstring (e.g., drillstring 20).

Drilling assembly 90 includes a drillstring 20 and a drill bit 100 coupled to the lower end of drillstring 20. Drillstring 20 is made of a plurality of pipe joints 22 connected end-to-end, and extends downward from the rotary table 14 through a pressure control device 15, such as a blowout preventer (BOP), into the borehole 26. The pressure control device 15 is commonly hydraulically powered and may contain sensors for detecting certain operating parameters and controlling the actuation of the pressure control device 15. Drill bit 100 is rotated with weight-on-bit (WOB) applied to drill the borehole 26 through the earthen formation. Drillstring 20 is coupled to a drawworks 30 via a kelly joint 21, swivel 28, and line 29 through a pulley. During drilling operations, drawworks 30 is operated to control the WOB, which impacts the rate-of-penetration of drill bit 100 through the formation. In this embodiment, drill bit 100 can be rotated from the surface by drillstring 20 via rotary table 14 and/or a top drive, rotated by downhole mud motor 55 disposed along drillstring 20 proximal bit 100, or combinations thereof (e.g., rotated by both rotary table 14 via drillstring 20 and mud motor 55, rotated by a top drive and the mud motor 55, etc.). For example, rotation via downhole motor 55 may be employed to supplement the rotational power of rotary table 14, if required, and/or to effect changes in the drilling process. In either case, the rate-of-penetration (ROP) of the drill bit 100 into the borehole 26 for a given formation and a drilling assembly largely depends upon the WOB and the rotational speed of bit 100 as well as the geometry of the drill bit 100 and its cutter elements.

During drilling operations a suitable drilling fluid 31 is pumped under pressure from a mud tank 32 through the drillstring 20 by a mud pump 34. Drilling fluid 31 passes from the mud pump 34 into the drillstring 20 via a desurger 36, fluid line 38, and the kelly joint 21. The drilling fluid 31 pumped down drillstring 20 flows through mud motor 55 and is discharged at the borehole bottom through nozzles in face of drill bit 100, circulates to the surface through an annular space 27 radially positioned between drillstring 20 and the sidewall of borehole 26, and then returns to mud tank 32 via a solids control system 36 and a return line 35. Solids control system 36 may include any suitable solids control equipment known in the art including, without limitation, shale shakers, centrifuges, and automated chemical additive systems. Control system 36 may include sensors and automated controls for monitoring and controlling, respectively, various operating parameters such as centrifuge rotations per minute (RPM). It should be appreciated that much of the surface equipment for handling the drilling fluid is application specific and may vary on a case-by-case basis.

Figure 2:
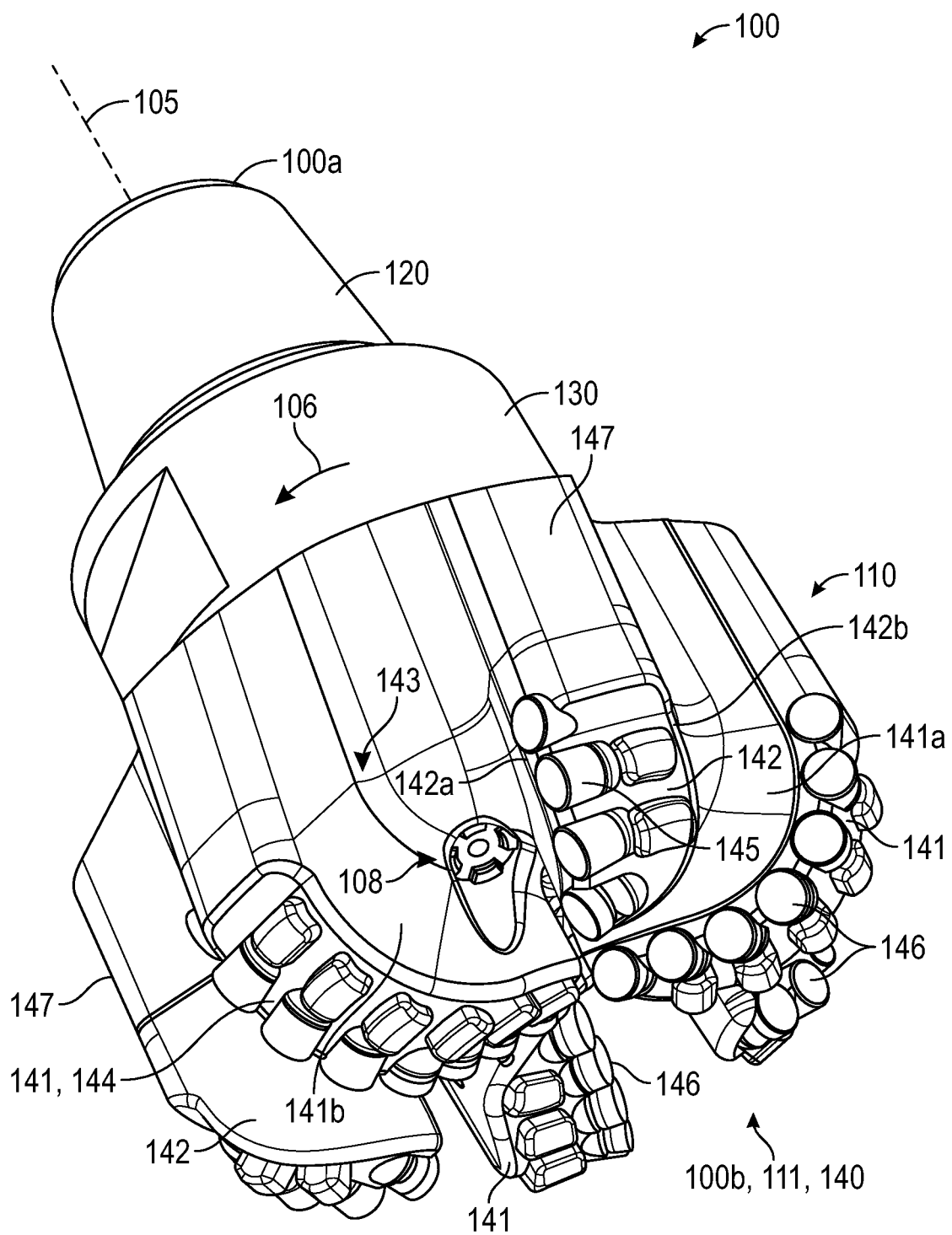
FIG. 2 is a perspective view of the drill bit of FIG. 1.

Referring now to FIG. 2, drill bit 100 is a fixed cutter bit, sometimes referred to as a drag bit, and is designed for drilling through formations of rock to form a borehole. Bit 100 has a central or longitudinal axis 105, a first or uphole end 100a, and a second or downhole end 100b. Bit 100 rotates about axis 105 in the cutting direction represented by arrow 106. In addition, bit 100 includes a bit body 110 extending axially from downhole end 100b, a threaded connection or pin 120 extending axially from uphole end 100a, and a shank 130 extending axially between pin 120 and body 110. Pin 120 couples bit 100 to drill string 20, which is employed to rotate the bit 100 to drill the borehole 26. Bit body 110, shank 130, and pin 120 are coaxially aligned with axis 105, and thus, each has a central axis coincident with axis 105.

The portion of bit body 110 that faces the formation at downhole end 100b includes a bit face 111 provided with a cutting structure 140. Cutting structure 140 includes a plurality of blades which extend from bit face 111. In some examples, cutting structure 140 includes three angularly spaced-apart primary blades 141, and three angularly spaced apart secondary blades 142. Although bit 100 is shown as having three primary blades 141 and three secondary blades 142, in general, bit 100 may comprise any suitable number of primary and secondary blades.

Primary blades 141 and secondary blades 142 are separated by drilling fluid flow courses 143. Each blade 141, 142 has a leading edge or side 141a, 142a, respectively, and a trailing edge or side 141b, 142b, respectively, relative to the direction of rotation 106 of bit 100.

Referring still to FIG. 2, each blade 141, 142 includes a cutter-supporting surface 144 for mounting a plurality of cutter elements 145. In particular, cutter elements 145 are arranged adjacent one another in a radially extending row proximal the leading edge of each primary blade 141 and each secondary blade 142. As used herein, the terms "leads," "leading," "trails," and "trailing" are used to describe the relative positions of two structures (e.g., cutter element) on the same blade relative to the direction of bit rotation. In particular, a first structure that is disposed ahead or in front of a second structure on the same blade relative to the direction of bit rotation "leads" the second structure (i.e., the first structure is in a "leading" position), whereas the second structure that is disposed behind the first structure on the same blade relative to the direction of bit rotation "trails" the first structure (i.e., the second structure is in a "trailing" position).

Each cutter element 145 has a cutting face 146 and comprises an elongated and generally cylindrical support member or substrate which is received and secured in a pocket formed in the surface of the blade to which it is fixed. In general, each cutter element may have any suitable size and geometry. In this embodiment, each cutter element 145 has substantially the same size and geometry. Cutting face 146 of each cutter element 145 comprises a disk or tablet-shaped, hard cutting layer of polycrystalline diamond or other superabrasive material that is bonded to the exposed end of the support member. In the embodiments described herein, each cutter element 145 is mounted such that its cutting face 146 is generally forward-facing. As used herein, "forward-facing" is used to describe the orientation of a surface that is substantially perpendicular to, or at an acute angle relative to, the cutting direction of the bit (e.g., cutting direction 106 of bit 100). For instance, a forward-facing cutting face (e.g., cutting face 146) may be oriented perpendicular to the direction of rotation 106 of bit 100, may include a backrake angle, and/or may include a siderake angle. However, the cutting faces are preferably oriented perpendicular to the direction of rotation 106 of bit 100 plus or minus a 45° backrake angle and plus or minus a 45° siderake angle. In addition, each cutting face 146 includes a cutting edge adapted to positively engage, penetrate, and remove formation material with a shearing action, as opposed to the grinding action utilized by impregnated bits to remove formation material. Such cutting edge may be chamfered or beveled as desired. In this embodiment, cutting faces 146 are substantially planar, but may be convex or concave in other embodiments.

Referring still to FIG. 2, bit body 110 further includes gage pads 147 of substantially equal axial length measured generally parallel to bit axis 105. Gage pads 147 are circumferentially-spaced about the radially outer surface of bit body 110. Specifically, one gage pad 147 intersects and extends from each blade 141, 142. In this embodiment, gage pads 147 are integrally formed as part of the bit body 110. In general, gage pads 147 can help maintain the size of the borehole by a rubbing action when cutter elements 145 wear slightly under gage. Gage pads 147 also help stabilize bit 100 against vibration. Further, a nozzle 108 is seated in the lower end of each flow passage 107. Together, passages 107 and nozzles 108 distribute drilling fluid around cutting structure 140 to flush away formation cuttings and to remove heat from cutting structure 140, and more particularly cutter elements 145, during drilling.

Figure 3:
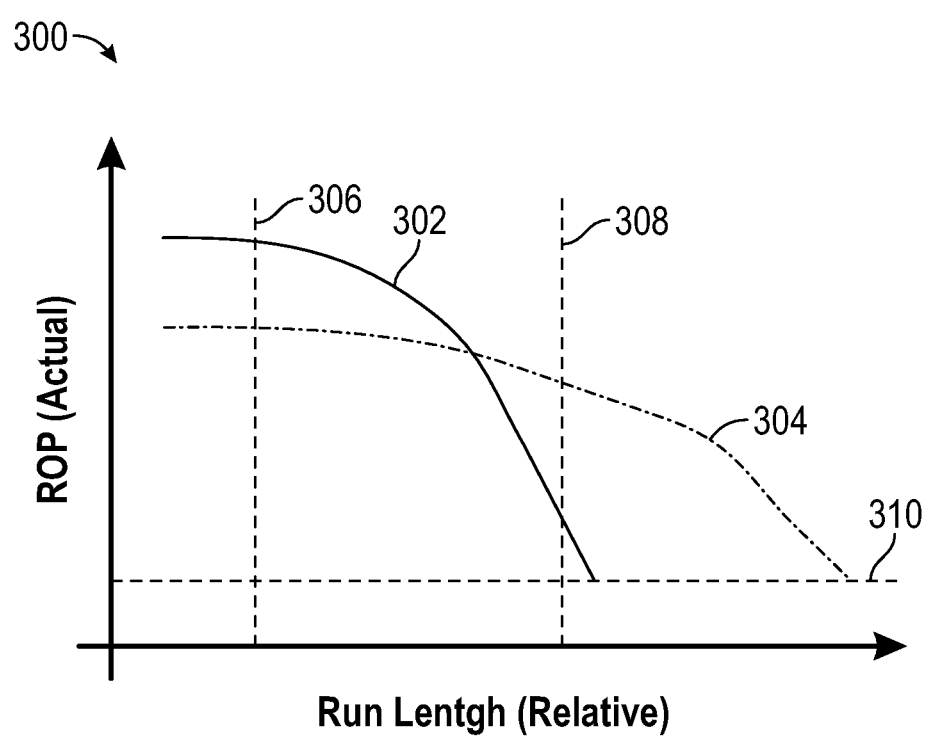
FIG. 3 is a graph comparing rate of penetration and run length for a variety of drill bits in accordance with the principles described herein.

Referring to FIG. 3, a graph 300 of ROP and run length as a function of time is shown, including a plot for a first drill bit 302 and a plot for a second drill bit 304. The ROP may be calculated for each drill bit 302, 304 based on similar operating/drilling such as RPM, weight on bit, and or type of drilling fluid. The plot for each drill bit 302, 304 represents a time series of ROP and corresponding run length data points. Although shown as continuous, the plots for each drill bit 302, 304 may also be discrete time series (e.g., measured every 10 seconds, every minute, every 10 minutes, and the like). For example, time progresses from left to right for the plot for each drill bit 302, 304. In this example, an earner point in time is labeled 306, while a later point in time is labeled 308.

As can be seen, initially (e.g., at time 306) the first drill bit 302 displays a higher ROP then the second drill bit 304. Conventionally, a higher ROP may have led to the first drill bit 302 being considered a preferable design. However, in accordance with examples of this disclosure, wear rates over time as cutter elements 145 of a drill bit become more worn are additionally taken into account. For example, while the first drill bit 302 performs better (e.g., has a greater ROP) when its cutter elements 145 are new or less worn, for example at time 306, the first drill bit 302 has a shorter overall lifespan (e.g., its cutter elements 145 wear faster over time), resulting in a shorter achievable run length reflected in the graph 300. By contrast, the second drill bit 304 displays a lower ROP at the time 306, relative to the first drill bit 302, but it achieves a longer overall lifespan or run length as its cutter elements 145 become worn, demonstrated by a higher ROP later in time (e.g., at time 308) and a longer run length reflected in the graph 300.

As will be explained further below, a threshold 310 reflects a point at which the ROP of each drill bit 302, 304 renders the drill bit no longer effective, or insufficiently effective, for penetrating an earthen formation.

Figure 4:
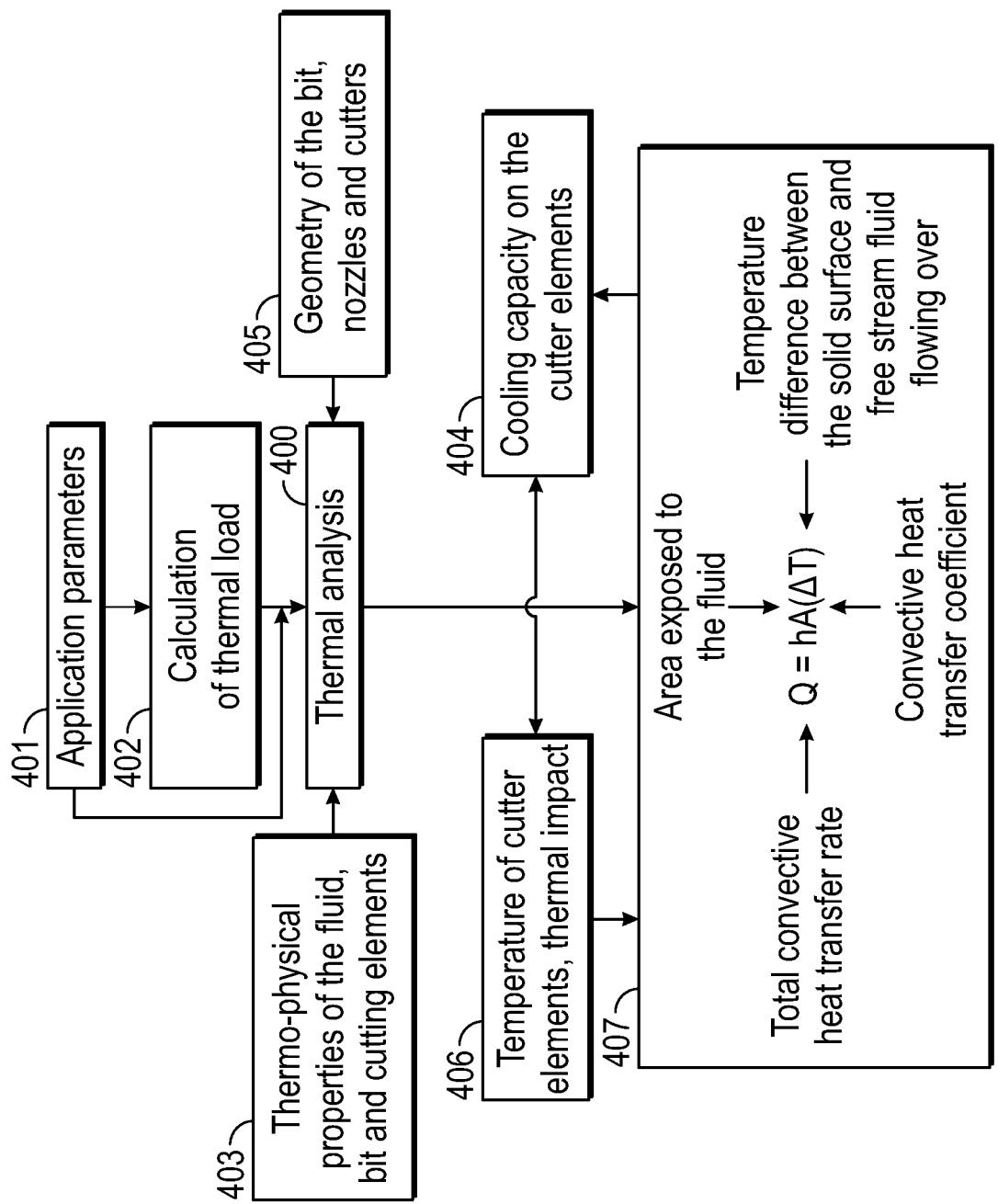
FIG. 4 is a flow chart of a method for performing thermal analysis of a drill bit and for determining cooling capacity of drilling fluid for cutter elements of the drill bit in accordance with the principles described herein.

Referring now to FIG. 4, a flow chart of one method 400 for thermal analysis of the cutter elements 145 of the drill bit 100 is shown. The thermal analysis method 400 begins in block 402 with estimating a thermal load value (e.g., thermal energy input to the cutter elements 145 during drilling operations) for the cutter elements 145 of the drill bit 100 using application parameters 401 such as rotary speed, depth of cut, cut areas, or other parameters relevant to engagement of the cutter element 145 with the earthen formation, as well as cutting forces (which are related to the type of material being cut, among other factors). Application parameters 401 may also include other information such as the flow rate or temperature of the drilling fluid pumped through the drill bit 100.

Next, using the parameters related to the geometry of the drill bit 100, the cutter elements 145, and the nozzles 108 (block 405), as well as thermophysical properties of the drilling fluid, the drill bit 100, and the cutter elements 145 (block 403), the thermal analysis 400 is conducted to calculate the temperature and the cooling capacities for each cutter element 145. These parameters comprise relevant information about the geometry of the cutter element 145, its position and orientation on the drill bit 100, the relative distance between one cutter element 145 and other cutter elements 145 (e.g., the distance between adjacent cutter elements 145), and other geometrical features of the drill bit 100 or the nozzles 108, including their shape, location, size, and orientation (block 405). The thermophysical properties 403 for the thermal analysis 400 include thermal conductivity of various portions of the drill bit 100, such as the diamond table, substrate, and body, as well as viscosity, thermal conductivity, heat capacity, and density of the drilling fluid. The thermal analysis 400 may use inputs from application parameters 401 depending on the analysis technique.

Based on some or all of the foregoing parameters, a variety of methods can be employed to calculate cutter element 145 temperatures (block 406) and/or the cooling capacity of drilling fluid (block 404). For example, finite element analysis, finite volume analysis, or similar numerical techniques can be used to solve the governing fluid and energy equations in the region (e.g., of the bit 100) of interest. A direct output of such a solution could be temperature values of various cutter elements 145 and the drilling fluid in proximity to those cutter elements 145. The cooling capacity of the drilling fluid may be computed based on the temperature outputs and other physical properties of the drilling fluid and the cutter elements 145. For example, different analysis techniques may be used to obtain these outputs with different degrees of accuracy, and there is no required method to obtain such outputs. Other possible techniques can include analytical solutions and empirical equations, among others.

In still other examples, temperatures of cutter elements 145 may be directly measured, for example by a temperature sensing device in relatively close proximity to the front face of the cutter element 145. In this example, a temperature value at the front face of the cutter element 145 may be extrapolated based on heat transfer or thermal conductivity equations (e.g., based on the distance between the location of the temperature measured by the temperature sensing device and the front face of the cutter element 145).

In some examples, cutter element temperatures (e.g., a temperature value associated with a cutter element) and cooling capacities may be utilized to calculate a thermal impact value (e.g., a delta-T value, or a temperature rise relative to a baseline value). It should be appreciated that various factors may influence thermal impact values for each cutter element 145. For example, a middle cutter element 145 in a grouping of cutter elements 145 may have an increased thermal impact value relative to an outer cutter element 145. Certain factors that lead to the increased thermal impact value of the middle cutter element 145 may include cutter load and speed or its proximity to other cutter elements 145 (e.g., having cutter elements 145 on either side in close proximity, whereas the outer cutter element 145 only has one cutter element 145 in close proximity), and the thermal conductivity of the surrounding material (e.g., the material near the middle cutter element 145 is warmer than the material near the outer cutter element 145, and thus more heat is conducted away from the outer cutter element 145 than the middle cutter element 145). Additionally, the available amount of cooling capacity provided by drilling fluid can also affect these temperatures. Therefore, it is also possible that the outer cutter element 145 is provided with relatively higher cooling capacity from the drilling fluid, contributing to its lower temperature.

Figure 5:
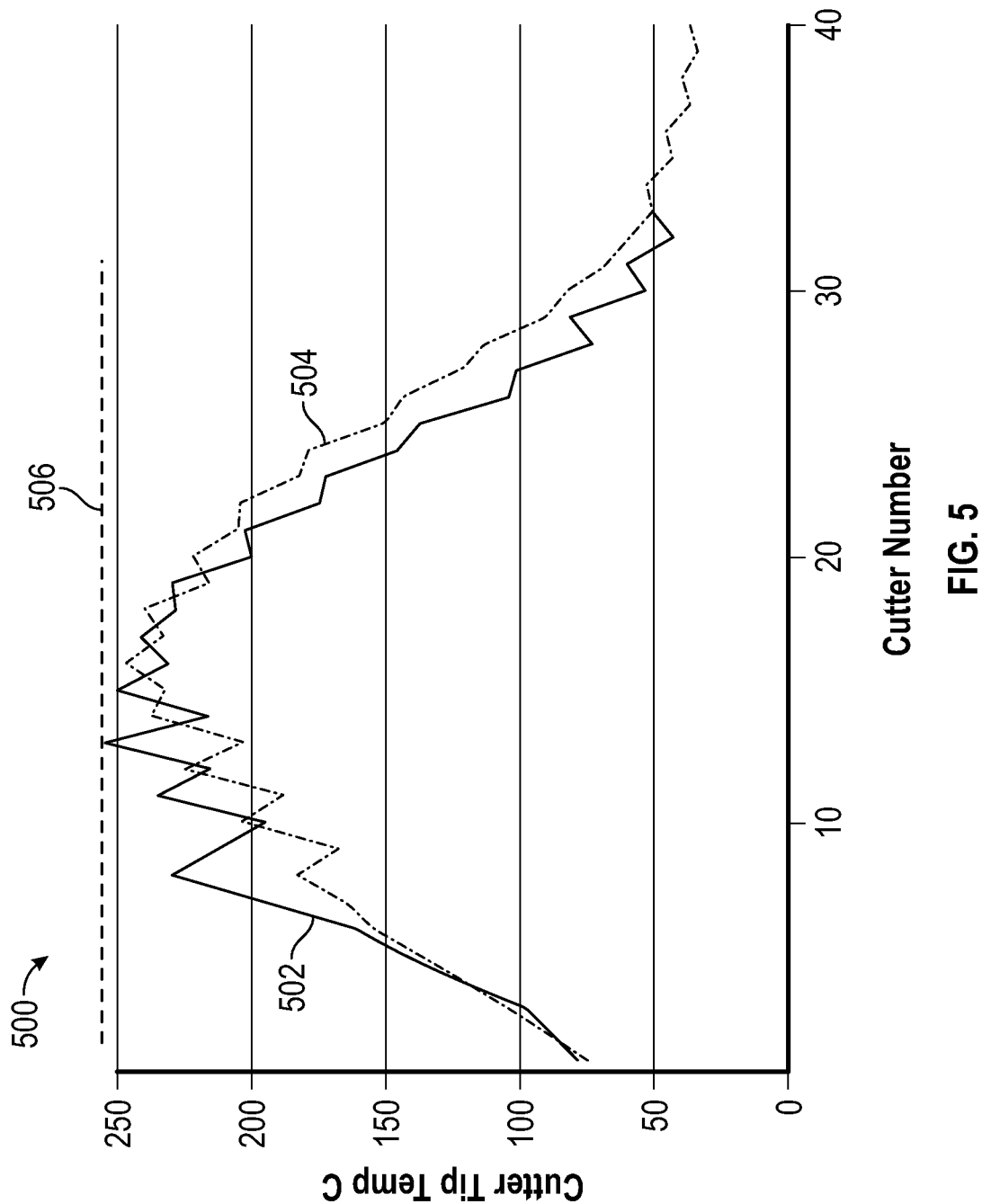
FIG. 5 is a graph representing temperature values on a per cutter element basis for a variety of drill bits in accordance with the principles described herein.

Referring now to FIG. 5, an example graph 500 of temperature values on a per cutter element 145 basis is shown, in which a plot for a first drill bit 502 is compared with a plot for a second drill bit 504. In the example graph 500, the y-axis represents estimated temperature values for the cutter elements of the drill bits 502 504 (e.g., during drilling). However, in another example, the y-axis may represent values that are delta-T values, or a temperature rise for each cutter element 145 of the respective drill bit 502, 504 relative to a baseline value (e.g., thermal impact values). The same plot may also be generated with the y-axis showing a wear number (e.g., representing cutter volume removed or wear area developed) on the various cutter elements of the drill bits 502, 504. In an example, the baseline value is the temperature of drilling fluid being pumped through the drill bit 502, 504. As can be seen in the example graph 500, certain cutter elements 145 experience a higher temperature than other cutter elements 145. Although not shown in FIG. 5, other embodiments of the present disclosure may present or group temperature values, delta-T values relative to a baseline, and/or cooling capacities as a function of cutter element 145 radius, or other physical properties of cutter elements 145 that, for example, differ among at least some of the cutter elements 145.

Referring back to FIG. 4, the temperature output 406 of thermal analysis 400 may correspond to any location on a cutter element 145. In some examples, the most relevant location of a cutter element 145 may be the cutter tip because it typically has the highest temperature due to engaging the earthen formation. However, in other examples, the temperature at other locations of the cutter element 145 is determined as the temperature output 406 and used to evaluate the cutter elements 145 of the drill bit 100.

Still referring to FIG. 4, in view of the equation 407, the method 400 for thermal analysis of the cutter elements 145 of the drill bit 100 also includes, in block 404, calculating or estimating a convective heat transfer rate for the cutter elements 145. In some cases, the cooling capacity of drilling fluid is then represented by either the convective cooling coefficient, h, which depends on a variety of factors including physical properties of the fluid and temperature of the cutter surface in contact with fluid, fluid velocity, local turbulence, viscosity, etc. In some cases, the cooling capacity comprises an area integral of the cooling coefficient h, over a certain surface area of the cutter element 145, which can be represented as h*A in equation 407. In another case, the total convective heat transfer rate, Q, can be the cooling capacity of the drilling fluid. The cooling capacity of the drilling fluid may be calculated for the front face of the cutter element 145 where the cutter element 145 is exposed to the drilling fluid. However, other cutter faces, or combinations thereof, may also be used to evaluate the cooling capacity.

Referring again to FIG. 5, a maximum temperature value 506 for the cutter elements 145 of the drill bits 502, 504 is shown. In the example of FIG. 5, only a single maximum 506 is shown for both drill bits 502, 504, However, in other examples, a maximum temperature value 506 for each drill bit 502, 504 may be calculated or identified. In accordance with an embodiment of this disclosure, a first wear value is estimated for and assigned to the cutter element 145 having the maximum temperature value 506. As one non-limiting, numerical example, the wear value assigned to the cutter element 145 having the maximum temperature value 506 is a value of 1. Additionally, wear values are estimated for and assigned to the other cutter elements 145 of the drill bits 502, 504 based on a ratio of the temperature value for a particular cutter element 145 to the maximum temperature value 506. For example, where the wear value for the cutter element 145 having the maximum temperature value 506 is 1, the wear value for a cutter element 145 having a temperature value half of the maximum temperature value 506 is 0.5.

Generally, the wear value for a particular cutter element 145 is a function of frictional interaction between the cutter element 145 and the earthen formation during drilling, and may be dependent upon a variety of factors such as temperature of the cutter element 145, drilling fluid type, cutter element 145 position and geometry, and the like. The wear value may be used to represent a physical quantity (e.g., a depth or distance) of material removed from a cutter element 145 for a given time period. For example, a particular wear value applied over a first time period may result in a first physical quantity of material removed from the cutter element 145; however, the same wear value applied over a second, longer time period may result in a second, greater physical quantity of material removed from the cutter element 145. As another example, a first wear value applied over a particular time period may result in a first physical quantity of material removed from the cutter element 145; however, a second, greater wear value applied over the same time period may result in a second, greater physical quantity of material removed from the cutter element 145. In some examples, the physical quantity associated with a particular wear value for a given time period may be based on experimental results, or simulations based on the frictional behavior of the cutter element 145 versus a given earthen formation.

Once wear values are estimated for the cutter elements 145 of the drill bits 502, 504, a design parameter of the cutter elements 145 of the drill bits 502, 504 is updated. In one example, the design parameter includes a cutter element 145 geometry (e.g., a cutter tip shape). In particular, the estimated wear value for a particular cutter element 145 is utilized to update the design parameter for that cutter element 145. In one example, the wear value for each cutter element 145 is associated with a wear depth value (e.g., a physical quantity of material removed from a cutter element 145), which is based on the geometry of a particular cutter element 145. In this example, updating the design parameter for the cutter element 145 includes updating the cutter element 145 tip geometry for that cutter element 145 to reflect its associated wear depth value as well as other geometrical features of that cutter element 145. As a non-limiting, numerical example, over a certain time period, a wear value of 1 corresponds to a wear depth of $\frac{1}{8}$" and thus a wear value of 0.5 over the same time period corresponds to a wear depth of $\frac{1}{16}$". Continuing this non-limiting example, the cutter element 145 having a wear value of 1 would have its associated wear depth increased by $\frac{1}{8}$" (e.g., $\frac{1}{8}$" of material removed), while the cutter element 145 having a wear value of 0.5 would have its associated wear depth increased by $\frac{1}{16}$" (e.g., $\frac{1}{16}$" of material removed).

Then, the steps of estimating temperature or other operational values, estimating wear values based on the temperature or other operational values, and updating design parameters based on the wear values are repeated until the design parameter value for at least one of the cutter elements 145 of the drill bits 502, 504 reaches a threshold value. For example, the temperature or other operational values for the cutter elements 145 are again estimated using the updated design parameter from the previous iteration (e.g., the increased wear depth for each of the cutter elements 145, resulting in simulated removal of material therefrom). Additionally, operational considerations may be taken into account when estimating the temperature or other operational values. For example, in one case the operational values are estimated assuming an increased WOB to maintain a relatively constant ROP despite increased wear of the cutter elements 145. In another case, the operational values are estimated assuming a relatively constant WOB, which will result in a reduced ROP when taking the wear of the cutter elements 145 into account. Once the temperature or other operational values are estimated, the wear values for the cutter elements 145 are again estimated using those updated, estimated temperature or other operational values. Further, the design parameter values for the cutter elements 145 are updated based on the updated, estimated wear values. In this way, the wear of the cutter elements 145 of the drill bits 502, 504 is predicted over time until at least one of the cutter elements 145 reaches a threshold value of wear, such as where a cutter element 145 becomes worn to the point of no longer engaging the formation (e.g., the cutter element 145 is flush with surrounding portions of the drill bit) or worn to the point where an attainable depth of cut is insufficiently low.

In some examples, a rate of penetration over time is estimated for the drill bits 502, 504 based on the updates to the design parameter values (e.g., change of the cut shape and/or depth of cut of the cutter elements 145 over time). For example a first rate of penetration for each drill bit 502, 504 is estimated using initial design parameter values for the cutter elements 145 of the drill bits 502, 504. Subsequently, the design parameter values for the cutter elements 145 are updated as described above, and a second rate of penetration for each drill bit 502, 504 is estimated using the updated design parameter values for the cutter elements 145 of the drill bits 502, 504. Additional rates of penetration may be calculated for each drill bit 502, 504 until, as explained above, at least one of the cutter elements 145 of the drill bits 502, 504 reaches a threshold value of wear.

A combination of the rates of penetration and time intervals between updating the design parameter values of the cutter elements 145 may additionally be used to estimate a run length for the drill bits 502, 504. For example, the first rate of penetration for each drill bit 502, 504 is multiplied by a time interval, while the second rate of penetration for each drill bit 502, 504 is multiplied by the time interval, and so on, resulting in a time series of run lengths, which can be summed. The combination of estimated rate of penetration, estimated run length, as a function of time may be used to generate a graph similar to that shown in FIG. 3.

Figure 6A:
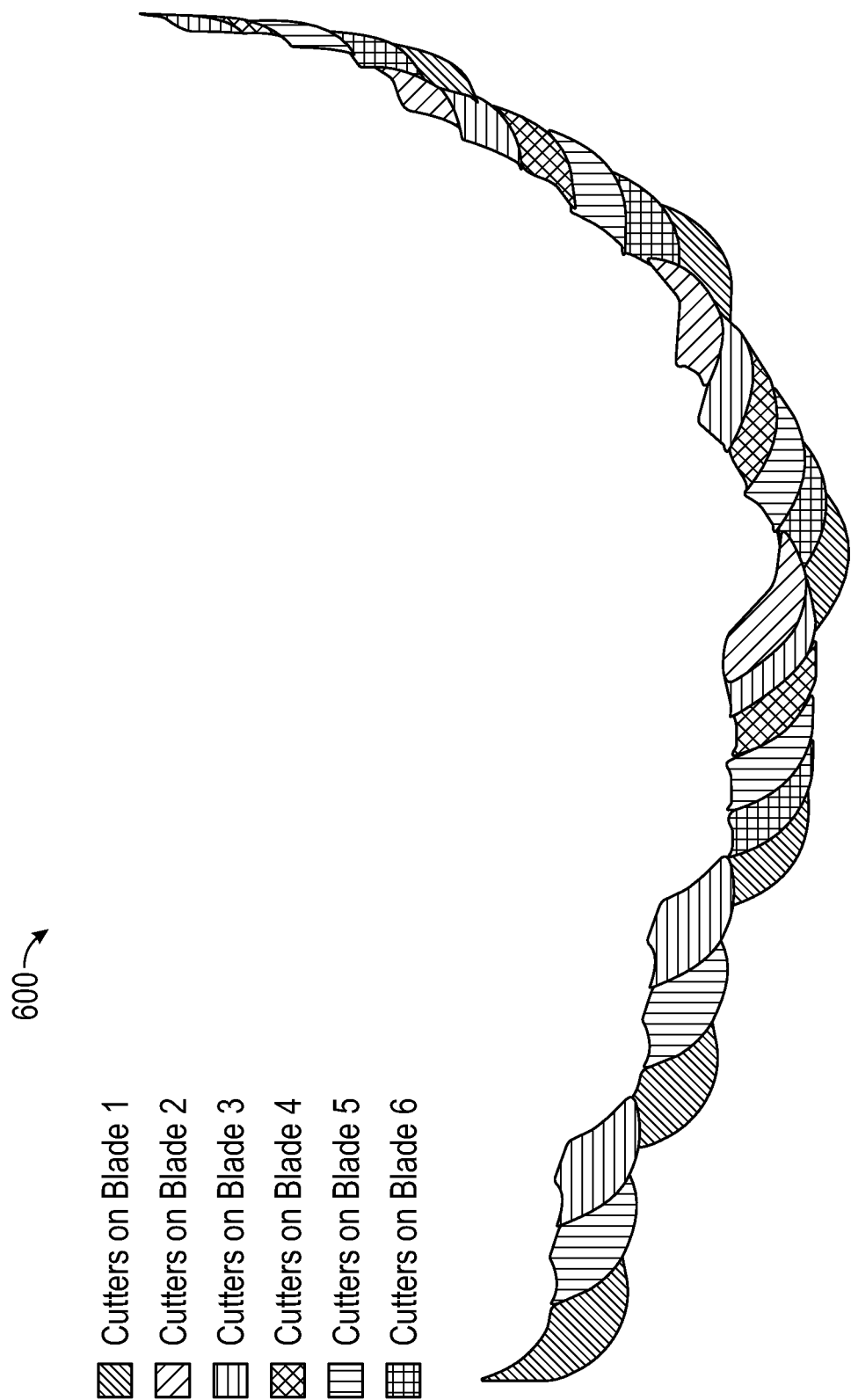
FIGS. 6a and 6b are graphical representations of cutter elements rotated into a single composite profile demonstrating a wear progression in accordance with the principles described herein.
Figure 6B:
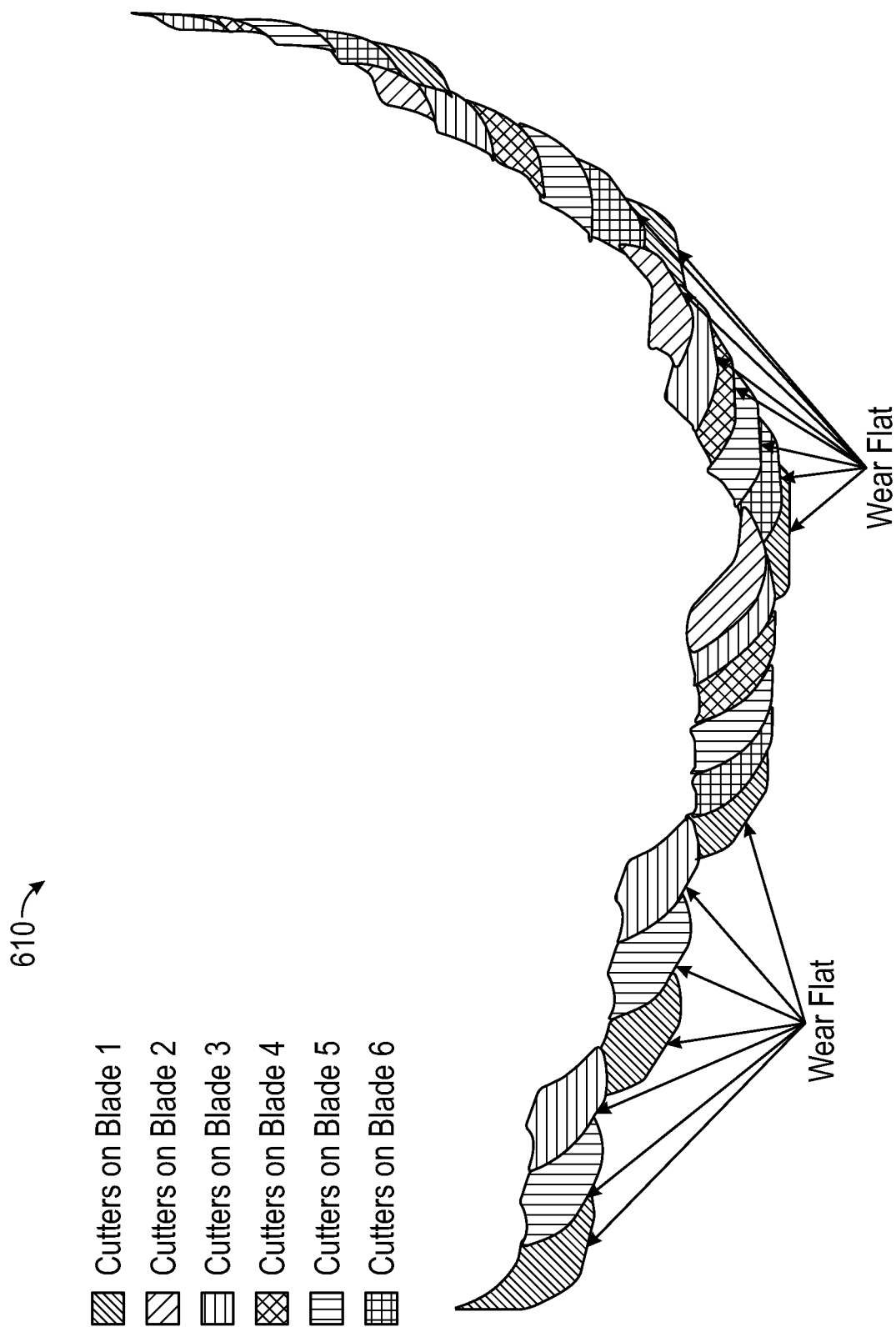

FIGS. 6a and 6b are graphical representations of cutter elements rotated into a single composite profile demonstrating a wear progression estimated according to examples of this disclosure. Referring first to FIG. 6a, an exemplary profile 600 is shown as it would appear with cutting faces rotated into a single rotated profile 600. The area of the profile 600 represents a volume of earthen formation removed in a single rotation of the drill bit 100. The profile 600 represents cutter elements 145 associated with one of six blades of the drill bit 100. In particular, areas of the profile 600 representing cutter elements 145 associated with a particular blade are color-coded in a like manner. The profile 600 represents an initial cutter element 145 geometry, for example where the drill bit 100 is new and thus the cutter elements 145 are unworn.

FIG. 6b shows an updated profile 610, which is also shown as it would appear with cutting faces rotated into a single profile 610. The profile 610 demonstrates wear on the cutter elements 145 (e.g., after one iteration of the method explained above). In this example, a tip geometry of each cutter element 145 is updated to be worn flat by an amount of material specified by the estimated wear value for that particular cutter element 145. In one example, the material is removed (i.e., the wear depth is increased) in a direction normal to the bottom hole profile at the engagement point between the cutter element 145 and the earthen formation by an amount specified by the calculated wear value for that particular cutter element.

Figure 7:
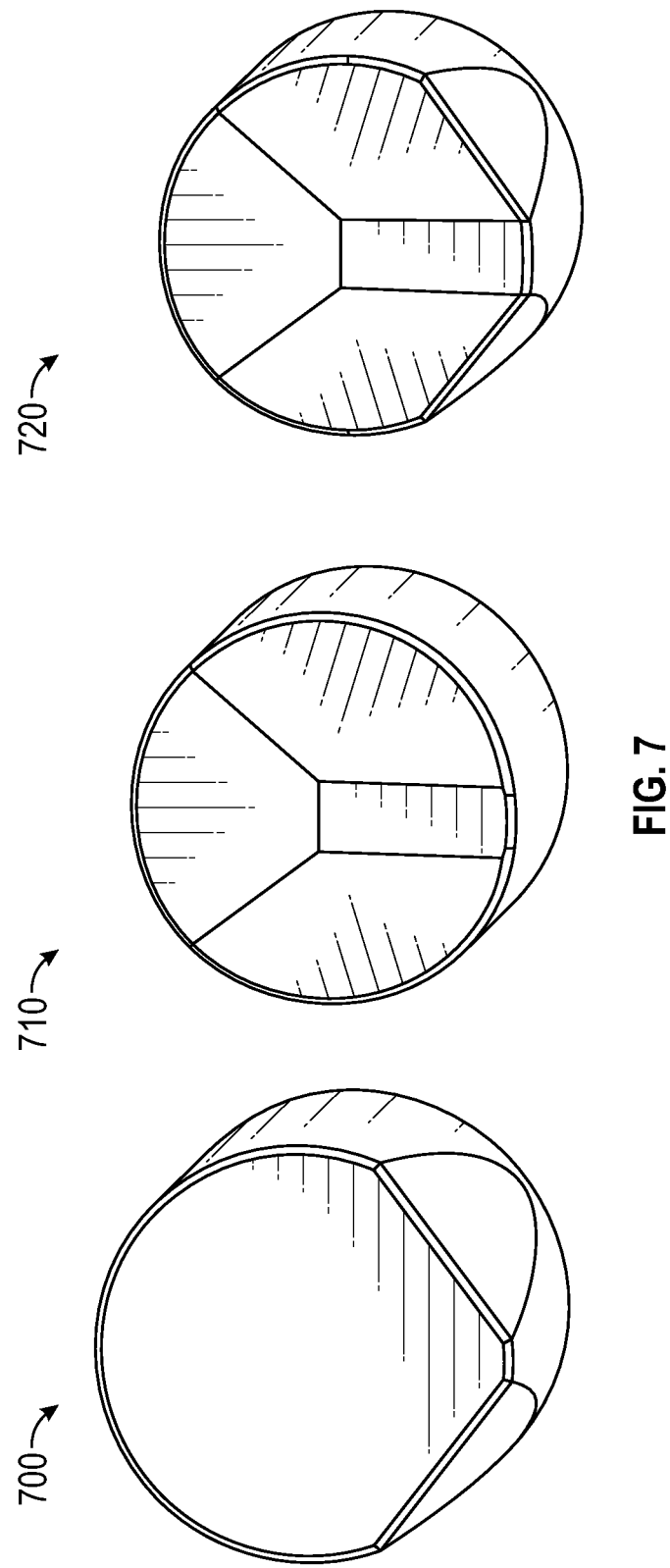
FIG. 7 shows various geometries of cutter elements in accordance with the principles described herein.

FIG. 7 shows different cutter element geometries 700, 710, 720, which may be employed on the cutter elements 145 of the drill bits described above. The cutter element geometries 700, 710, 720 depict shaped cutter elements, which may be used in place of planar cutter elements in certain examples.

Figure 8:
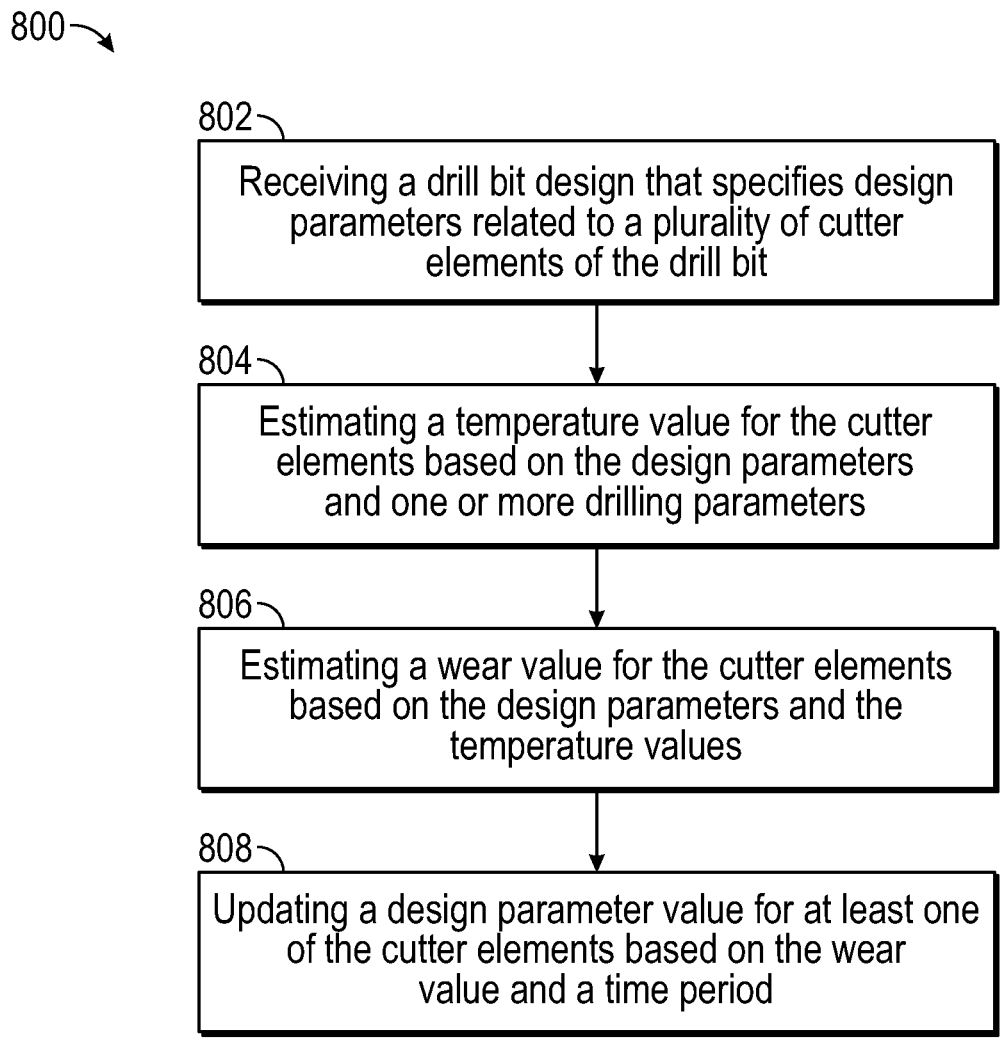
FIG. 8 is a flow chart of a method for using an operating parameter for cutter elements of a drill bit to estimate or predict wear of the cutter elements over time, in accordance with the principles described herein.

FIG. 8 shows a flow chart of a method 800 in accordance with examples of this disclosure. The method 800 begins in block 802 with receiving a drill bit design that specifies design parameters related to a plurality of cutter elements of the drill bit. The method 800 continues in block 804 with estimating a temperature value for the cutter elements based on the design parameters and one or more drilling parameters. The method 800 then continues in block 806 with estimating a wear value for the cutter elements based on the design parameters and the thermal impact values.

Once the wear value is estimated for the cutter elements in block 806, the method 800 continues in block 808 with updating a design parameter value for at least one of the cutter elements based on the wear value and a time period. Using the updated design parameter value, the method 800 repeats the steps of estimating the temperature value (block 804), estimating the wear value (block 806), and updating the design parameter value (block 808) until the design parameter value for at least one of the cutter elements reaches a threshold value, at which point the method 800 ends.

Once some or all of the temperature or other operational values, wear values, updated design parameters of the cutter elements 145, associated rates of penetration, and run lengths for the drill bits 502, 504 have been estimated or calculated, embodiments of the present disclosure may include generating a graphical display of the various data, for example as shown in FIGS. 3, 5, 6a, and 6b.

In certain embodiments of the present disclosure, remedial action may be taken to increase the estimated run length for a drill bit. The remedial action may include changing design parameters of the drill bit 100 such as position, shape, or other physical attributes of the cutter elements 145; position, shape, or other physical attributes of the nozzles 108; and overall geometry of the drill bit 100. The remedial action may also include operational changes, such as altering the drilling fluid flow rate or the drilling fluid type.

In certain embodiments, the remedial action taken may be manual (e.g., an engineer modifies design parameters of the drill bit 100), while in other embodiments, the remedial action taken may be automated (e.g., a computer program modifies design parameters of the drill bit 100 based on an understanding of the impact(s) of such modifications on wear over time of the cutter elements 145 of the drill bit 100 and the corresponding impact on estimated run length for the drill bit 100).

By modifying the design parameters of the drill bit 100 in response to a determination that the drill bit 100 experiences accelerated wear over time (e.g., displays initially superior rate of penetration, but that deteriorates more quickly, negatively impacting the achievable run length), the run length for a drill bit 100 is improved upon, which in turn increases the expected lifespan of the drill bit 100. In some embodiments, the design parameters of the drill bit 100 are manually adjusted (e.g., by an engineer viewing the preliminary graphical display 602). In other embodiments, the design parameters of the drill bit 100 are automatically adjusted, for example by a software tool. In certain cases, the software tool modifies certain design parameters of the drill bit 100 and again performs the methods described herein to generate intermediate data that represent the impact of the modifications to the drill bit 100 design parameters. In this way, the software tool may take an iterative approach to modifying design parameters of the drill bit 100 to improve the overall lifespan or achievable run length for the drill bit 100.

Embodiments of this disclosure may include software instructions, embodied on a non-transitory computer-readable medium that, when executed by a computer (e.g., a processor), causes the computer to perform some or all of the method steps described herein. Further, the various described graphical displays may be displayed on a computer monitor, printed as a hard copy, or otherwise displayed to a user. In the examples where modifications to the design parameters of a drill bit 100 are carried out by a software tool executed on a computer, one or more of the described graphical display elements may not be actually displayed to a user, although the data that would otherwise be displayed (e.g., the cooling capacities and thermal impact values on a per cutter element 145 basis) may be taken into account by the software tool in modifying the design parameters of the drill bit 100.

Figure 9:
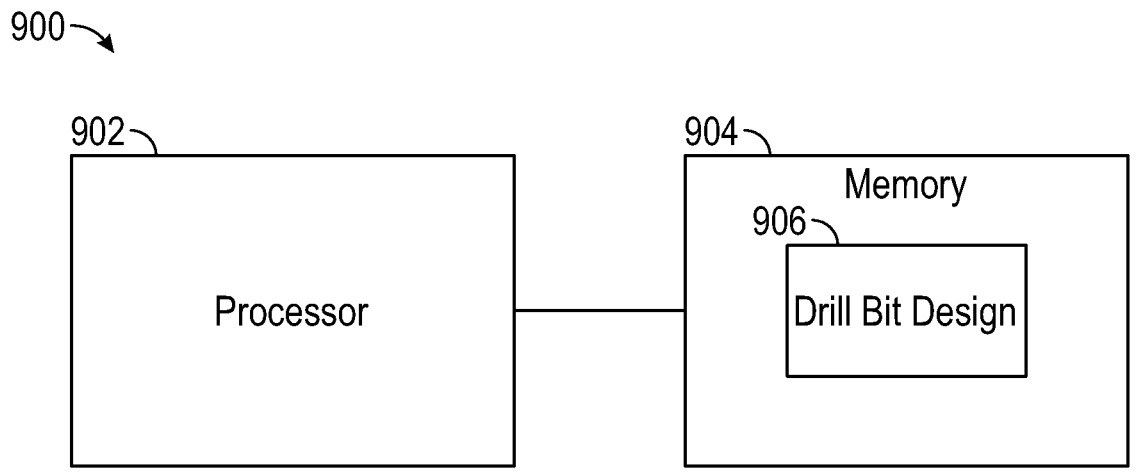
FIG. 9 is a block diagram of a system for using an operating parameter for cutter elements of drill bit to estimate or predict wear of the cutter elements over time, in accordance with the principles described herein.

FIG. 9 is a block diagram of a system 900 in accordance with various examples. The system 900 may be a computing device, such as a personal computing device, a mobile computing device, a cloud- or network-connected computing device, and the like. The system 900 includes a processor 902 coupled to a memory 904. In some examples, the processor 902 and the memory 904 are co-located (e.g., in the same computing device) while in other examples the processor 902 is situated remotely from the memory 904. Regardless, the processor 902 is configured to access data stored in the memory 904. The processor 902 may include one or more general purpose processor units, processor cores, and the like. The memory 904 is configured to store a drill bit design 906, for example that specifies a design parameter for cutter elements 145 of a drill bit 100 as described above. The processor 902 is configured to receive or otherwise access the drill bit design 906 stored in the memory 904, and to perform the various functionality described herein. For example, the processor 902 is configured to estimate a temperature value for the cutter elements 145 based on the design parameter and a drilling parameter. The processor 902 may also be configured to estimate a wear value for the cutter elements 145 based on the design parameter and the temperature value. The processor 902 may further be configured to update a value of the design parameter for at least one of the cutter elements 145 based on the wear value and a time period. Finally, the processor may be configured to use the updated design parameter value to again estimate the temperature value, estimate the wear value, and update the design parameter value until the design parameter value for the at least one of the cutter elements 145 reaches a threshold value.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Similarly, methods to calculate the temperature values, cooling capacity, wear depth values, and the like may also vary which may include, individually or collectively, different numerical algorithms, empirical correlations, analytical solutions or approximations. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method, comprising:
   a) receiving a first drill bit design that specifies a design parameter for each of a plurality of cutter elements of a drill bit;
   b) estimating a temperature value for each of the cutter elements based on the design parameter and a drilling parameter;

c) estimating a wear value for each of the cutter elements based on the design parameter and the temperature value;
d) generating an updated design parameter value for at least one of the cutter elements based on the wear value for the at least one cutter element and a time period;
using the updated design parameter value as the design parameter for the at least one of the cutter elements, repeating steps b) through d) until the updated design parameter value for the at least one of the cutter elements reaches a threshold value;
estimating a rate of penetration over time for the first drill bit design based on a change in the design parameter over time until the updated design parameter value for the at least one of the cutter elements reaches the threshold value;
estimating a first run length for the first drill bit design based on a change in the rate of penetration over time until the updated design parameter value for the at least one of the cutter elements reaches the threshold value;
generating a second drill bit design by updating a geometry of cutter elements in the first drill bit design, a geometry of drilling fluid nozzles in the first drill bit design, or a combination thereof; and
producing a drill bit based on the second drill bit design, wherein an estimated run length for the second drill bit design is greater than the first run length.

2. The method of claim 1, wherein:
the estimated wear value for one of the cutter elements that has a highest temperature value comprises a first value; and
the estimated wear value for another one of the cutter elements comprises a ratio of the temperature value for the other cutter element to the highest temperature value.

3. The method of claim 2, wherein the first value is 1.

4. The method of claim 1, wherein updating further comprises:
associating a wear depth with the wear value for a cutter element; and
changing the design parameter by the wear depth for the cutter element.

5. The method of claim 4, wherein the design parameter having an updated value comprises a tip geometry of the at least one of the cutter elements.

6. The method of claim 1, further comprising estimating a depth of cut or cut shape over time based on the change in the design parameter over time.

7. The method of claim 1, wherein the geometry of cutter elements in the first drill bit design comprises one or more selected from a list consisting of: a location and an orientation of cutter elements in the first drill bit design;
a number of cutter elements in the first drill bit design; and
a type, a size, a shape, and/or a length of cutter elements in the first drill bit design,
wherein the geometry of drilling fluid nozzles in the first drill bit design comprises one or more selected from a list consisting of: a number of drilling fluid nozzles in the first drill bit design; and a size, a shape, a location, and/or an orientation of nozzles in the first drill bit design,
wherein the second drill bit design is generated by additionally updating a drill bit geometry of the first drill bit design, a drilling fluid type and/or flow rate, or a combination thereof.

8. The method of claim 1, wherein the threshold value for the updated design parameter value is selected such that the at least one of the cutter elements reaching the threshold value indicates that the at least one of the cutter elements is fully worn.

9. A non-transitory, computer-readable medium containing instructions that, when executed by a processor, cause the processor to:
a) receive a first drill bit design that specifies a design parameter for each of a plurality of cutter elements of a drill bit;
b) estimate a temperature value for each of the cutter elements based on the design parameter and a drilling parameter;
c) estimate a wear value for each of the cutter elements based on the design parameter and the temperature value;
d) generate an updated design parameter value for at least one of the cutter elements based on the wear value for the at least one cutter element and a time period;
using the updated design parameter value as the design parameter for the at least one of the cutter elements, repeat steps b) through d) until the updated design parameter value for the at least one of the cutter elements reaches a threshold value;
estimate a rate of penetration over time for the first drill bit design based on a change in the design parameter over time until the updated design parameter value for the at least one of the cutter elements reaches the threshold value;
estimate a first run length for the first drill bit design based on a change in the rate of penetration over time until the updated design parameter value for the at least one of the cutter elements reaches the threshold value;
generate a second drill bit design by updating a geometry of cutter elements in the first drill bit design, a geometry of drilling fluid nozzles in the first drill bit design, or a combination thereof; and
produce a drill bit based on the second drill bit design, wherein an estimated run length for the second drill bit design is greater than the first run length.

10. The non-transitory, computer-readable medium of claim 9, wherein:
the estimated wear value for one of the cutter elements that has a highest temperature value comprises a first value; and
the estimated wear value for another one of the cutter elements comprises a ratio of the temperature value for the other cutter element to the highest temperature value.

11. The non-transitory, computer-readable medium of claim 10, wherein the first value is 1.

12. The non-transitory, computer-readable medium of claim 9, wherein the instructions, when executed by the processor to update the design parameter value, further cause the processor to:
associate a wear depth with the wear value for a cutter element; and
change the design parameter by the wear depth for the cutter element.

13. The non-transitory, computer-readable medium of claim 12, wherein the design parameter having an updated value comprises a tip geometry of the at least one of the cutter elements.

14. The non-transitory, computer-readable medium of claim 9, wherein the instructions, when executed by the processor, further cause the processor to estimate a depth of cut or cut shape over time based on the change in the design parameter over time.

15. The non-transitory, computer-readable medium of claim 9, wherein the geometry of cutter elements in the first drill bit design comprises one or more selected from a list consisting of: a location and an orientation of cutter elements in the first drill bit design; a number of cutter elements in the first drill bit design; and a type, a size, a shape, and/or a length of cutter elements in the first drill bit design, wherein the geometry of drilling fluid nozzles in the first drill bit design comprises one or more selected from a list consisting of: a number of drilling fluid nozzles in the first drill bit design; and a size, a shape, a location, and/or an orientation of nozzles in the first drill bit design, wherein the second drill bit design is generated by additionally updating a drill bit geometry of the first drill bit design, a drilling fluid type and/or flow rate, or a combination thereof.

16. The non-transitory, computer-readable medium of claim 9, wherein the threshold value for the updated design parameter value is selected such that the at least one of the cutter elements reaching the threshold value indicates that the at least one of the cutter elements is fully worn.

17. A system, comprising:
one or more processors; and
one or more memories coupled to the one or more processors, wherein the memories are configured to store a first drill bit design that specifies a design parameter for each of a plurality of cutter elements of a drill bit, and wherein the memories comprise instructions that, when executed by the one or more processors, cause the one or more processors to be configured to:
   a) receive the first drill bit design from the one or more memories;
   b) estimate a temperature value for each of the cutter elements based on the design parameter and a drilling parameter;
   c) estimate a wear value for each of the cutter elements based on the design parameter and the temperature value;
   d) generate an updated design parameter value for at least one of the cutter elements based on the wear value for the at least one cutter element and a time period;
   using the updated design parameter value as the design parameter for the at least one of the cutter elements, repeat steps b) through d) until the updated design parameter value for the at least one of the cutter elements reaches a threshold value;
   estimate a rate of penetration over time for the first drill bit design based on a change in the design parameter over time until the updated design parameter value for the at least one of the cutter elements reaches the threshold value;
   estimate a first run length for the first drill bit design based on a change in the rate of penetration over time until the updated design parameter value for the at least one of the cutter elements reaches the threshold value;
   generate a second drill bit design by updating a geometry of cutter elements in the first drill bit design, a geometry of drilling fluid nozzles in the first drill bit design, or a combination thereof; and
   produce a drill bit based on the second drill bit design,
wherein an estimated run length for the second drill bit design is greater than the first run length.

18. The system of claim 17, wherein:
the estimated wear value for one of the cutter elements that has a highest temperature value comprises a first value; and
the estimated wear value for another one of the cutter elements comprises a ratio of the temperature value for the other cutter element to the highest temperature value.

\* \* \* \* \*